(12) United States Patent
Khouri et al.

(10) Patent No.: US 7,618,840 B2
(45) Date of Patent: Nov. 17, 2009

(54) SUBLITHOGRAPHIC CONTACT STRUCTURE, IN PARTICULAR FOR A PHASE CHANGE MEMORY CELL, AND FABRICATION PROCESS THEREOF

(75) Inventors: Osama Khouri, Milan (IT); Giorgio Pollaccia, Villafrati (IT); Fabio Pellizzer, Follina (IT)

(73) Assignees: STMicroelectronics S.r.l., Agrate Brianza (IT); Ovonyx, Inc., Boise, ID (US)

( * ) Notice: Subject to any disclaimer, the term of this patent is extended or adjusted under 35 U.S.C. 154(b) by 480 days.

(21) Appl. No.: 11/468,153

(22) Filed: Aug. 29, 2006

(65) Prior Publication Data

US 2006/0284160 A1 Dec. 21, 2006

Related U.S. Application Data

(62) Division of application No. 10/756,195, filed on Jan. 13, 2004, now Pat. No. 7,122,824.

(30) Foreign Application Priority Data

Jan. 15, 2003 (EP) .................................. 03425016

(51) Int. Cl.
H01L 21/00 (2006.01)
(52) U.S. Cl. ............................ 438/95; 438/98; 438/103; 257/E21.068
(58) Field of Classification Search .................... 438/3, 438/84, 95, 98, 102–103; 257/E21.068
See application file for complete search history.

(56) References Cited

U.S. PATENT DOCUMENTS

| | | | |
|---|---|---|---|
| 5,789,277 A | 8/1998 | Zahorik et al. | |
| 5,814,527 A | 9/1998 | Wolstenholme et al. | |
| 5,952,671 A | 9/1999 | Reinberg et al. | |
| 5,970,336 A | 10/1999 | Wolstenholme et al. | |
| 6,031,287 A | 2/2000 | Harshfield | |
| 6,238,946 B1 | 5/2001 | Ziegler | |
| 6,316,784 B1 | 11/2001 | Zahorik et al. | |
| 6,440,837 B1 | 8/2002 | Harshfield | |
| 6,512,241 B1 | 1/2003 | Lai | |

(Continued)

FOREIGN PATENT DOCUMENTS

WO 00/57498 9/2000

(Continued)

OTHER PUBLICATIONS

Palun, L., et al., "Fabrication of Single Electron Device by Hybrid (E-Beam/DUV) Lithography," Microelectronic Engineering, 53: 167-170, 2000.

*Primary Examiner*—Thanhha Pham
(74) *Attorney, Agent, or Firm*—Lisa K. Jorgenson; Robert Iannucci; Seed IP Law Group PLLC

(57) ABSTRACT

A contact structure for a PCM device is formed by an elongated formation having a longitudinal extension parallel to the upper surface of the body and an end face extending in a vertical plane. The end face is in contact with a bottom portion of an active region of chalcogenic material so that the dimensions of the contact area defined by the end face are determined by the thickness of the elongated formation and by the width thereof.

29 Claims, 8 Drawing Sheets

U.S. PATENT DOCUMENTS

| | | |
|---|---|---|
| 6,541,333 B2 | 4/2003 | Shukuri et al. |
| 6,545,287 B2 | 4/2003 | Chiang |
| 6,586,761 B2 | 7/2003 | Lowrey |
| 6,613,604 B2 | 9/2003 | Maimon et al. |
| 6,617,192 B1 | 9/2003 | Lowrey et al. |
| 6,750,079 B2 | 6/2004 | Lowrey et al. |
| 6,759,267 B2 | 7/2004 | Chen |
| 6,943,365 B2 | 9/2005 | Lowrey et al. |
| 6,969,866 B1 | 11/2005 | Lowrey et al. |
| 7,205,562 B2 * | 4/2007 | Wicker .......................... 257/2 |
| 2001/0002046 A1 | 5/2001 | Reinberg et al. |
| 2002/0017701 A1 | 2/2002 | Klersy et al. |
| 2002/0070401 A1 | 6/2002 | Takeuchi et al. |
| 2003/0075778 A1 | 4/2003 | Klersy |
| 2003/0219924 A1 | 11/2003 | Bez et al. |
| 2003/0231530 A1 | 12/2003 | Bez et al. |
| 2004/0012009 A1 | 1/2004 | Casagrande et al. |
| 2004/0113181 A1 | 6/2004 | Wicker |
| 2004/0126925 A1 * | 7/2004 | Rodgers et al. ............... 438/95 |
| 2004/0166604 A1 | 8/2004 | Ha et al. |
| 2004/0245603 A1 | 12/2004 | Lowrey et al. |

FOREIGN PATENT DOCUMENTS

| | | |
|---|---|---|
| WO | 02/09206 | 1/2002 |

* cited by examiner

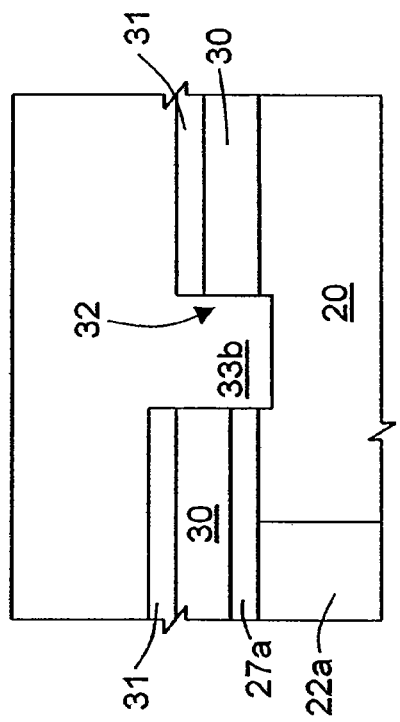
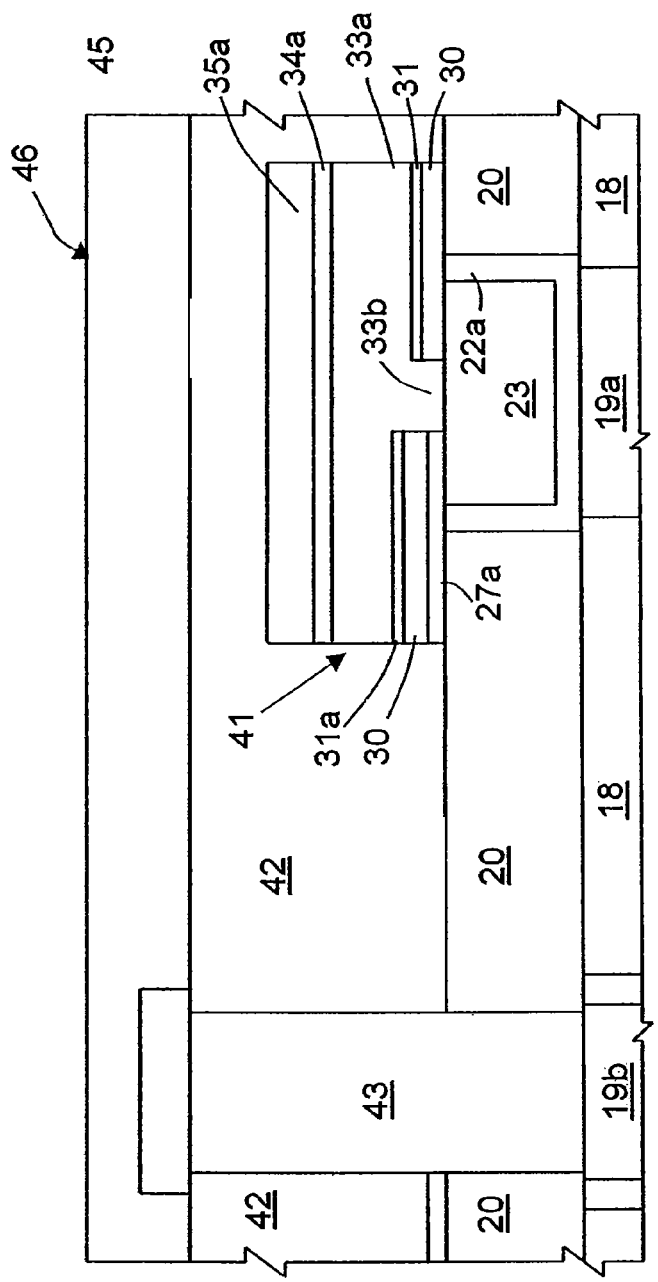

SUBLITHOGRAPHIC CONTACT STRUCTURE, IN PARTICULAR FOR A PHASE CHANGE MEMORY CELL, AND FABRICATION PROCESS THEREOF

BACKGROUND OF THE INVENTION

1. Field of the Invention

The present invention relates to a sub lithographic contact structure, in particular for a phase change memory cell, and a fabrication process thereof.

2. Description of the Related Art

As is known, phase change memory cells utilize a class of materials that have the unique property of being reversibly switchable from one phase to another with measurable distinct electrical properties associated with each phase. For example, these materials may change between an amorphous disordered phase and a crystalline, or polycrystalline, ordered phase. A material property that may change and provide a signature for each phase is the material resistivity, which is considerably different in the two states.

At present, alloys of elements of group VI of the periodic table, such as Te or Se, referred to as chalcogenides or chalcogenic materials, can advantageously be used in phase change cells. The currently most promising chalcogenide is formed by a Ge, Sb and Te alloy ($Ge_2Sb_2Te_5$), which is currently widely used for storing information in overwritable disks.

In chalcogenides, the resistivity varies by two or more magnitude orders when the material passes from the amorphous phase (more resistive) to the polycrystalline phase (more conductive) and vice versa, as shown in FIG. 1. Furthermore, in the amorphous phase, resistivity strongly depends also on temperature, with variations of one magnitude order every 100° C., with a behavior similar to that of P-type semiconductor materials.

Phase change may be obtained by locally increasing the temperature, as shown in FIG. 2. Below 150° C. both phases are stable. Above 200° C. (temperature of start of nucleation, designated by $T_x$), fast nucleation of the crystallites takes place, and, if the material is kept at the crystallization temperature for a sufficient time (time $t_2$), it changes its phase and becomes crystalline. To bring the chalcogenide back into the amorphous state, it is necessary to raise the temperature above the melting temperature $T_m$ (approximately 600° C.) and then to cool the chalcogenide off rapidly (time $t_1$).

From the electrical standpoint, it is possible to reach both critical temperatures, namely the crystallization and the melting temperatures, by causing a current to flow through a resistive element which heats the chalcogenic material by the Joule effect.

The basic structure of a PCM element 1 which operates according to the principles described above is shown in FIG. 3 and comprises a first electrode 2 (of resistive type, forming a heater); a programmable element 3 and a second electrode 5. The programmable element 3 is made of a chalcogenide and is normally in the polycrystalline state after processing. One part of the programmable element 3 is in direct contact with the first electrode 2 and forms the active portion affected by phase change, hereinafter referred to as the phase change portion 4.

In the PCM element 1 of FIG. 3, technological and electrical considerations impose that the contact area between the first electrode and the programmable element has small dimensions, so that, for the same current density, the writing operation may be carried out at the required local thermal energy with smaller current consumption.

Several proposals have been presented for reducing the contact area. For example, U.S. Pat. No. 6,294,452 discloses a process for forming a contact area of sublithographic dimensions, based on isotropically etching a polysilicon layer. The resulting sublithographic dimensions depend on the quality of the etching.

US 2001/0002046 discloses a process for forming an electrode of a chalcogenide switching device, wherein a spacer layer deposited in a lithographic opening is anisotropically etched and laterally defines an electrode. The resulting width of the electrode depends on the thickness of a spacer layer.

European patent application 01128461.9, filed on May 12, 2001, and entitled "Small Area Contact Region, High Efficiency Phase Change Memory Cell, And Manufacturing Method Thereof", teaches forming the contact area as an intersection of two thin portions extending transversely with respect to one another and each of a sublithographic size. In order to form the thin portions, deposition of layers is adopted.

In all the indicated prior solutions, any variation in the electrode width L (FIG. 3), due for example to the process tolerances, affects, in a linear way, the contact area of the active region 4. Thus, the width L may have tolerances that are not acceptable as regards repeatability and uniformity of the cell characteristics.

BRIEF SUMMARY OF THE INVENTION

An embodiment of the invention provides a contact region having an area less dependent on the process variations.

According to one aspect of the invention, the contact area is formed laterally to the active region and has a height and width. Advantageously, the height of the contact area is determined by the thickness of a deposited layer, which is technologically controlled and may be designed to be sublithographic. Furthermore, according to another aspect of the invention, the width of the contact area is determined by the width of a spacer which may also be designed of sublithographic dimensions and may be dimensionally controlled with a good accuracy.

One embodiment of the invention is an electronic PCM device that includes: a body of semiconductor material having lower surface; a dielectric layer extending on top of the body; and a PCM memory cell that includes a PCM storage element formed in the dielectric layer and a selection element. The storage element is formed by a heater element and a storage region. The storage region is of chalcogenic material and is in electric contact with the heater element, wherein the heater element has an end face extending transversely to the lower surface and forming a contact area with the storage region.

BRIEF DESCRIPTION OF THE DRAWINGS

For the understanding of the present invention, a preferred embodiment is now described, purely as a non-limitative example, with reference to the enclosed drawings, wherein:

FIGS. 13-16 are cross-sections of the PCM memory element, in subsequent manufacturing steps, taken in a perpendicular plane with respect to FIGS. 7-11.

DETAILED DESCRIPTION OF THE INVENTION

Figure 4:
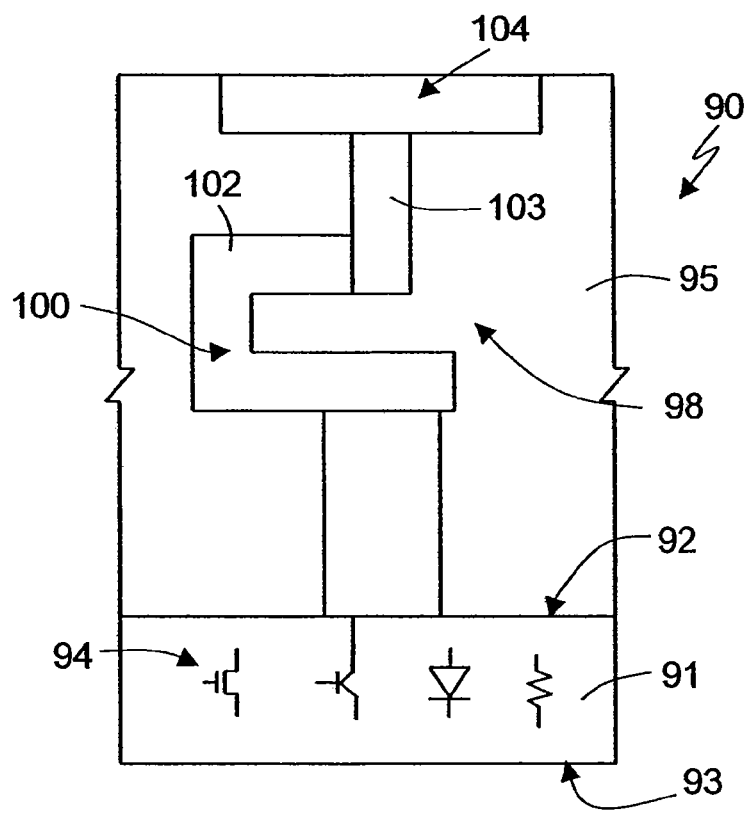
FIG. 4 shows a cross-section of a contact structure according to the present invention.

FIG. 4 illustrates the basic structure of a contact structure according to one embodiment of the invention. In detail, an electronic device 90 has a body 91 (e.g., a substrate) of monocrystalline material defining an upper surface 92 and a lower surface 93 and accommodating electronic components 94, represented schematically. A dielectric layer 95 extends on top of the body 91 and accommodates the contact structure, indicated at 98. The contact structure 98 is formed by a first electrode 100 and an active region 103 of chalcogenic material. The first electrode 100, connected to the electronic components 94 as shown schematically for one of them, has a horizontal portion 102 adjacent to and in contact with the active region 103. A second electrode 104 is formed on the active region 103 and is in electric contact therewith.

Figure 1:
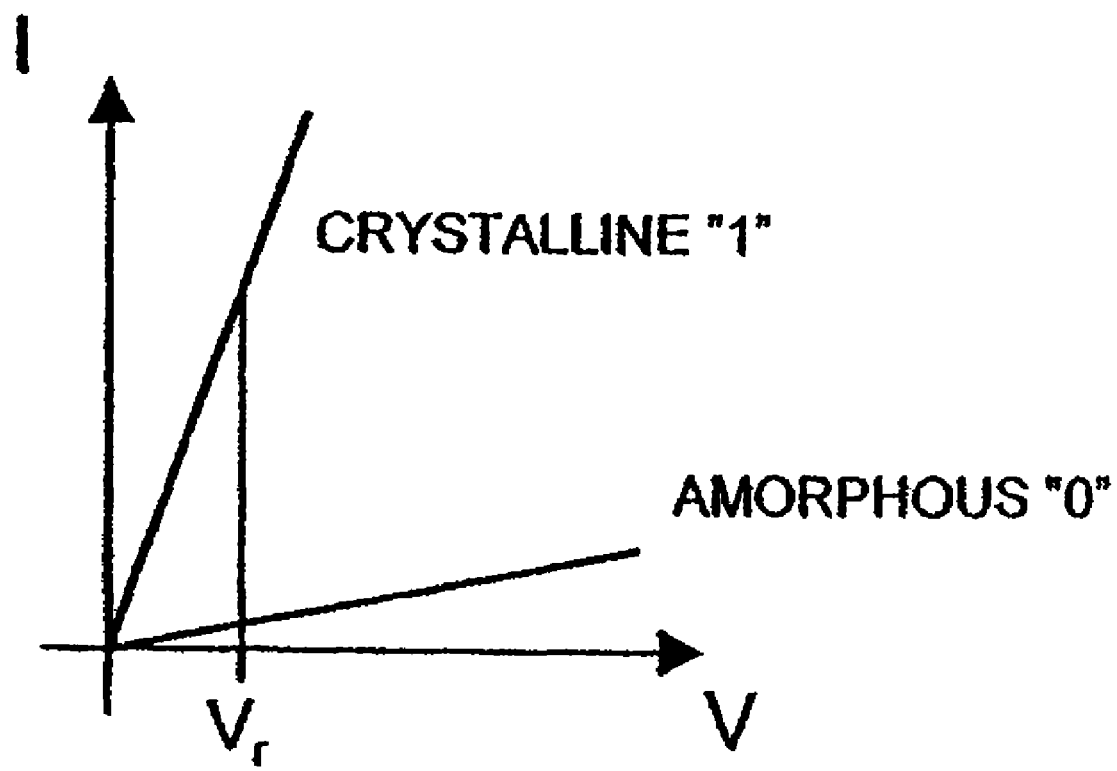
FIG. 1 illustrates the characteristic low field current-voltage of a phase change material.
Figure 2:
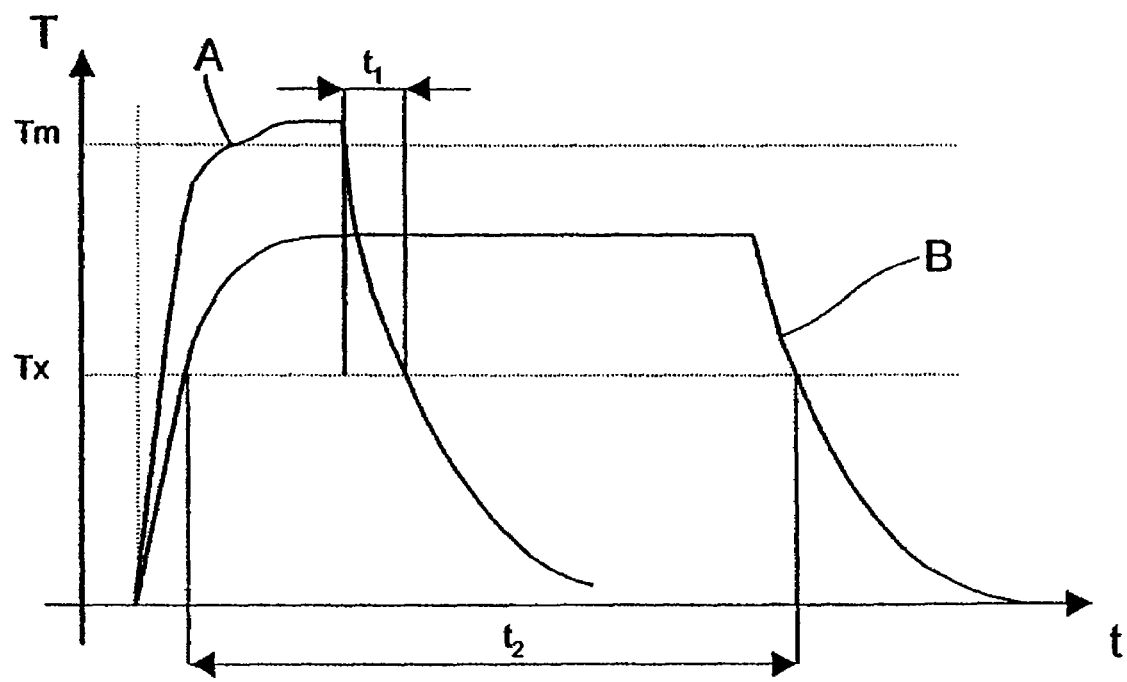
FIG. 2 shows the temperature versus time plot of a phase change material.
Figure 3:
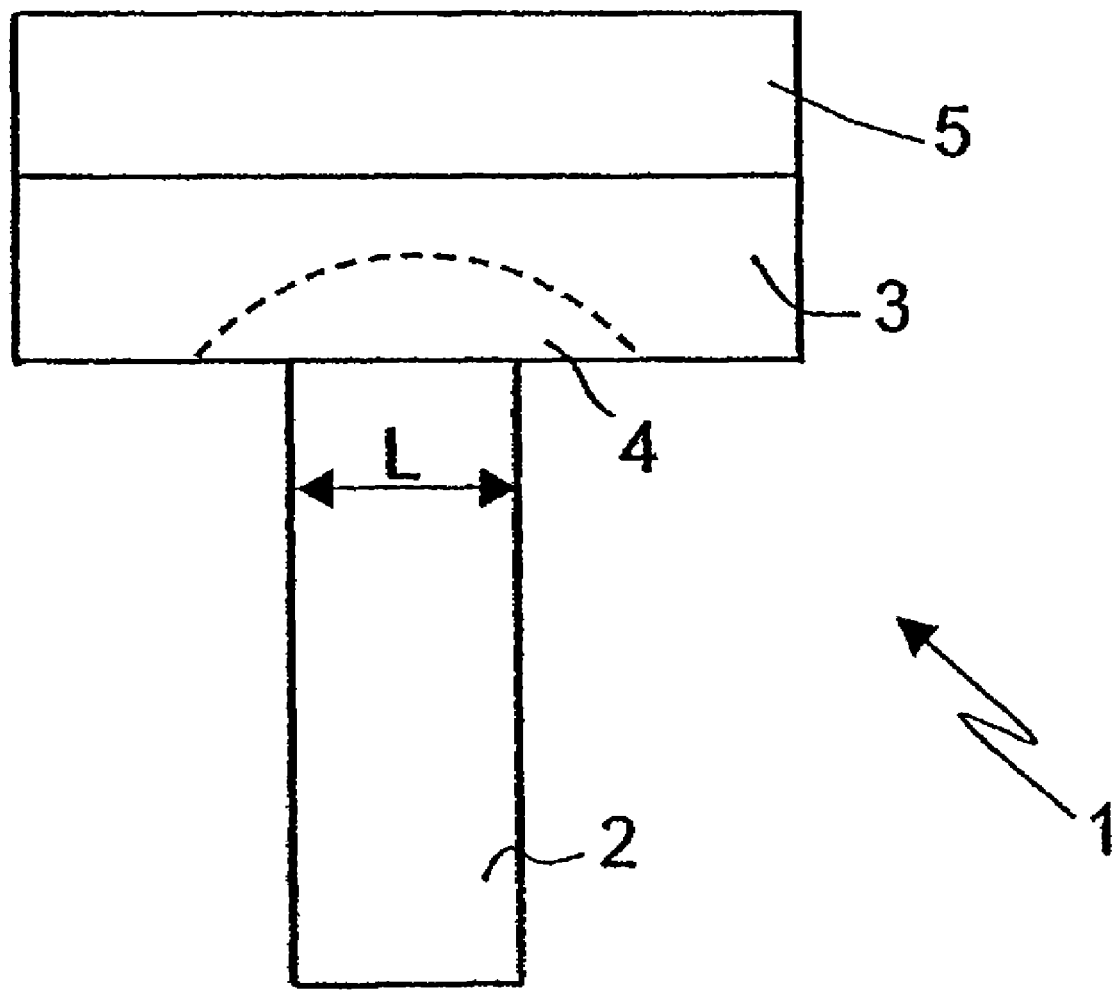
FIG. 3 shows the basic structure of a PCM memory element.
Figure 5:
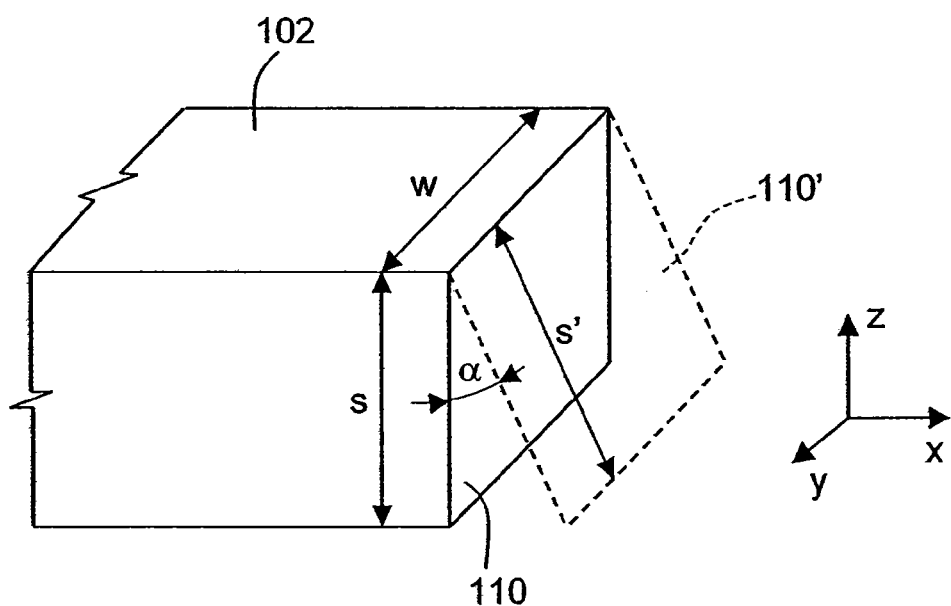
FIG. 5 is a perspective view of a portion of the contact structure of FIG. 4 showing the variability of the contact area due to technological tolerances.

As better shown in the perspective view FIG. 5, the horizontal portion 102 has an elongated shape extending along a longitudinal direction X parallel to the upper and lower surfaces 92, 93 of the body 91. The horizontal portion 102 is longitudinally delimited by an end face 110. The end face 110 extends in a vertical plane, which is ideally perpendicular to the longitudinal direction X and thus to the upper and lower surfaces 92, 94 and defines a lateral contact area with the active region 103. The end face 110 is here rectangular and has a height S (extending parallel to direction Z) and a width W (extending parallel to direction Y). The portion of the active region 103 adjacent to the end face 110 undergoes phase change and thus corresponds to the active region 4 of FIG. 3.

Because of the vertical arrangement of the end face 110 and thus of the contact area, the height S is equal to the thickness of the horizontal portion 102 of the first electrode 100, and thus may be designed to be sublithographic, that is smaller than the minimum dimension obtainable through optical UV lithography.

In practice, the contact structure 98 according to FIGS. 4, 5 is formed by an elongated formation (horizontal portion 102 of the first electrode 100) having a longitudinal extension parallel to the upper surface 92 of the body 91 and an end face 110 extending in a vertical plane and in contact with the active region 103 so that the dimensions of the contact area (defined by the end face 110) are determined by the thickness S of the elongated formation and by the width W thereof.

The height S of the horizontal portion 102 and thus of the contact area is more controllable than the electrode width L of prior art contact structures (FIG. 3), so that PCM cells having the contact structure of FIG. 4 have more uniform dimensions than prior art cells. The thickness tolerance of a conductive layer forming the horizontal portion 102 allows, for same overall dimensions, a higher constructive confidence than electrodes the contact area whereof depends on the width L.

The height S also depends on the quality of the operation used to define the end face 110, in particular by the etching operation used to this end. FIG. 5 shows the possible variation of the contact area in case etching does not ensure exact verticality of the end face 110, so that horizontal portion 102 has an inclined end face, indicated at 110', forming an angle α with ideal end face 110 (which, as said, is perpendicular to the upper surface 92). In this case, the height S' of the inclined end face 110' is greater than height S by a quantity depending on the angle α, since $$S' = S/\cos\alpha.$$

In the worst cases, with current technologies, α<5°, so that cosα≅1 [cos(5°)=0.99619]. Since any variation of height S has the same impact on the contact area, the variation of the contact area due to process tolerances affecting the height S is lower than 2%.

Furthermore, also the width W may be sublithographic, by exploiting the spacer technique, as discussed later on, with reference to FIGS. 7-12. This technique has a tolerance of ±10%.

The process for manufacturing the contact structure of FIG. 4 will be now described, with reference to FIGS. 6-16.

Figure 6:
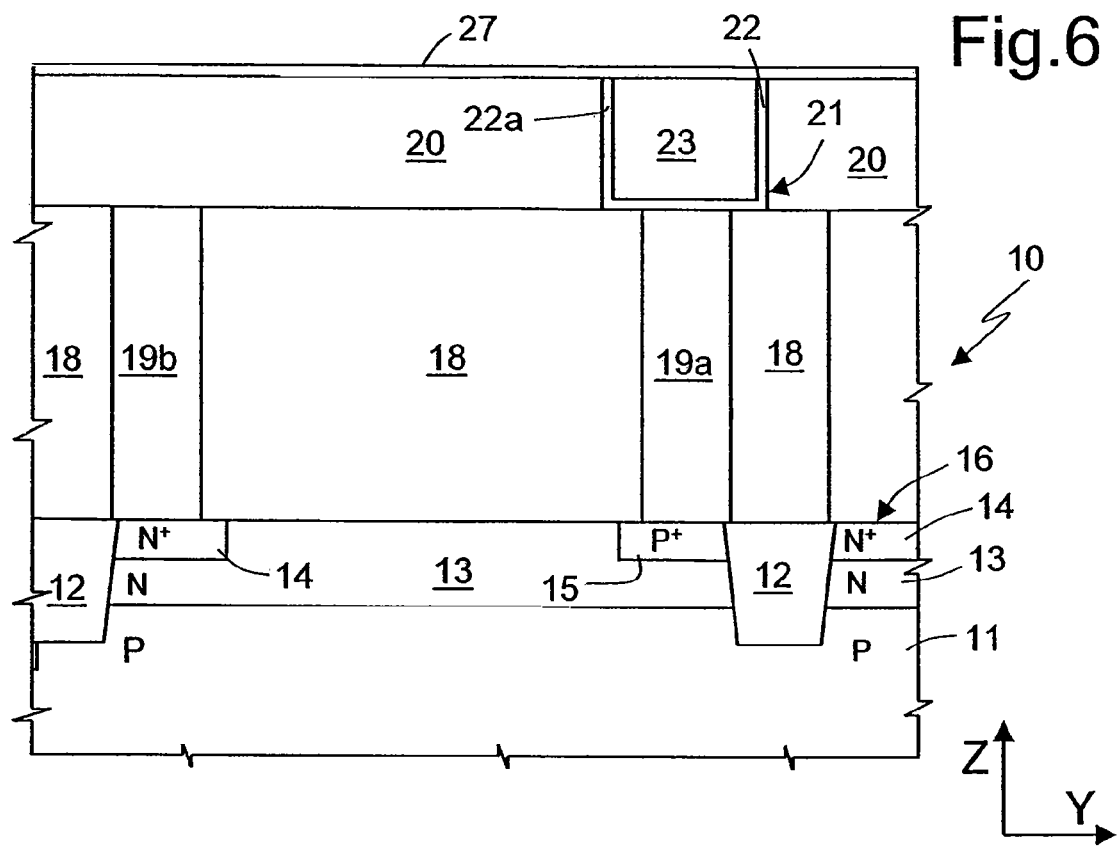
FIG. 6 is a cross-section of a PCM memory element in an initial manufacturing step.

First, FIG. 6, a wafer 10 comprising a P-type substrate 11 having an upper surface 16 is subjected to standard front end steps. In particular, inside the substrate 11 insulation regions 12 are formed and delimit active areas; then, in succession, base regions 13 of N-type, base contact regions 14 of N$^+$-type, and emitter regions 15 of P$^+$-type are implanted. The base regions 13, base contact regions 14, and emitter regions 15 form diodes or bipolar transistors that define selection elements for the memory cells.

Next, a first dielectric layer 18 is deposited and planarized; openings are formed in the first dielectric layer 18 above the base contact regions 14 and emitter regions 15, and the openings are filled with tungsten to form emitter contacts 19a and base contacts 19b. Then, a second dielectric layer 20—for example, an undoped silicon glass (USG)—is deposited, and openings 21, for example, cylindrical-shaped, are formed in the second dielectric layer 20 above the emitter contact 19a. Next, a cup-shaped region 22 is formed, e.g., by depositing an electrode layer, for example of TiSiN, TiAlN or TiSiC, that conformally coats the walls and bottom of the openings 21, a dielectric material is then deposited filling the openings 21, and then the dielectric material and electrode layer are subsequently removed outside the openings 21, using conventional planarization techniques such as Chemical Mechanical Polishing (CMP). The cup-shaped region 22 thus has a vertical wall 22a extending along the cylindrical side surface of the openings 21.

Then, a conductive layer 27 (for instance TaSiN, TiSiN, TiN, TiAlN, etc.) having a thickness of 5-50 nm, corresponding to the desired height S of the contact area 110 is deposited, thus obtaining the structure of FIG. 6. As visible, the conductive layer 27 extends parallel to the upper surface 16 of substrate 11.

At this point, a mask is exposed and the conductive layer 27 is selectively etched in order to form stripes parallel to the y-direction.

Figure 14:
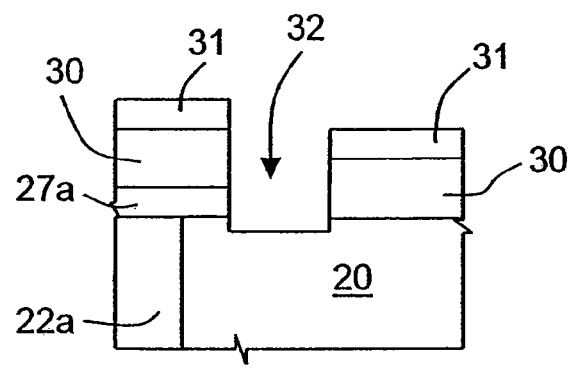

The width of these stripes has to be enough to ensure that the strips touch the conductive ring formed by the vertical walls 22a on one side and be cut by the trench etch described in FIG. 14 on the other side.

Figure 7:
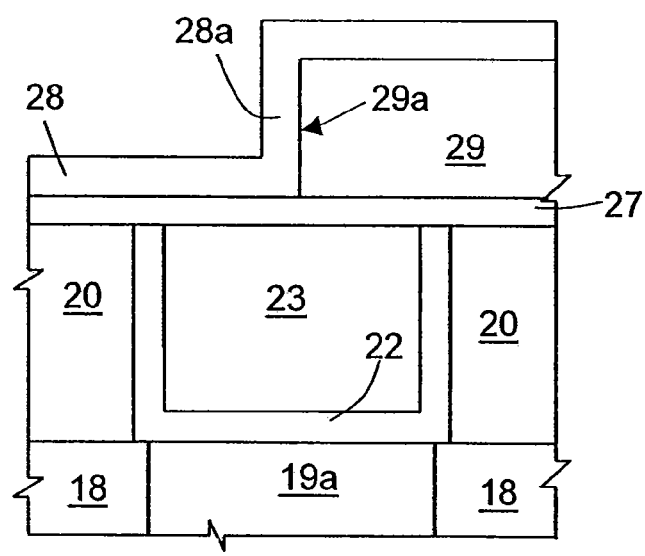
FIGS. 7-11 are cross-sections of an enlarged detail of FIG. 6, in subsequent manufacturing steps.
Figure 8:
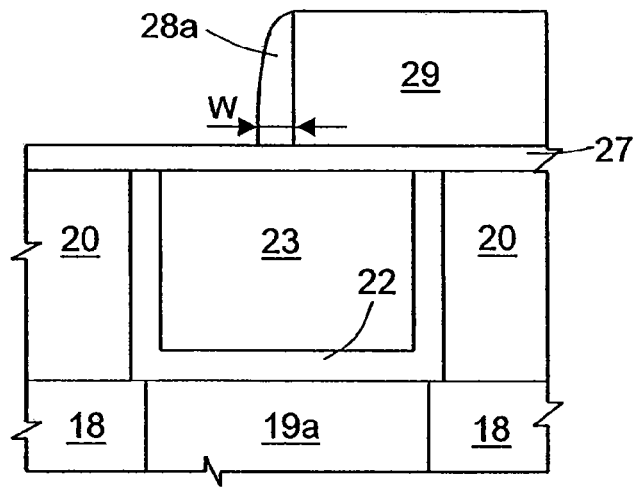

Next, FIG. 7, a delimiting layer 29 of insulating material, for example oxide, is deposited. The delimiting layer 29 has a thickness of, for instance, 20-200 nm. Then, using a mask, one part of the delimiting layer 29 is removed by dry etching to form a step which has a vertical side 29a that extends vertically on top of the dielectric material 23, and crosses the vertical wall 22a of cup-shaped region 22 (at a point located before or behind the drawing plane, and thus not visible in FIG. 7).

Next, a sacrificial layer 28, for example nitride with a thickness of 5-50 nm, is deposited conformally. In particular, the sacrificial layer 28 forms a vertical wall 28a that extends along the vertical side 29a of the delimiting layer 29. Thus, the structure of FIG. 7 is obtained.

Thereafter (FIG. 8), the sacrificial layer 31 undergoes an anisotropic etching that results in removal of the horizontal portions of the sacrificial layer 28 and of part of the vertical wall 28a. By appropriately choosing the thickness of the delimiting layer 29 and the thickness of the sacrificial layer 28, as well as the time and type of etching, it is possible to obtain the desired sublithographic width W for the bottom part of the remaining vertical wall 28a.

Figure 9:
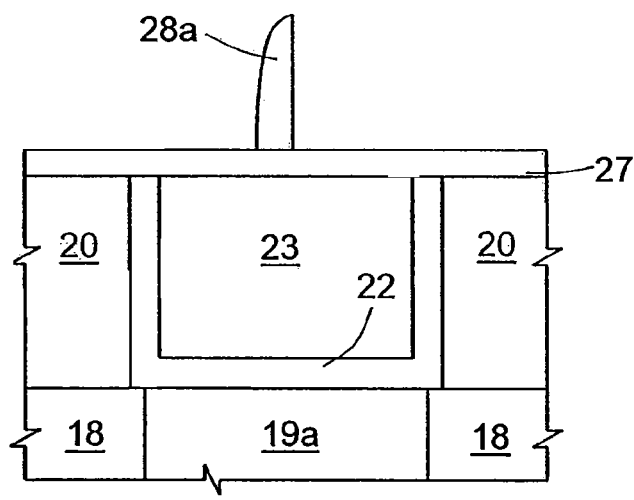
Figure 10:
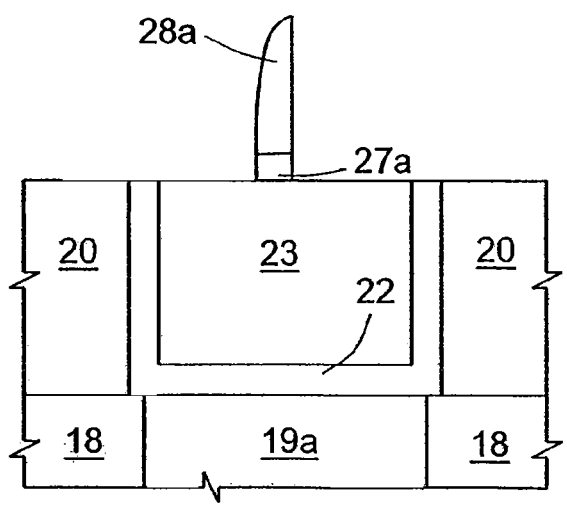
Figure 11:
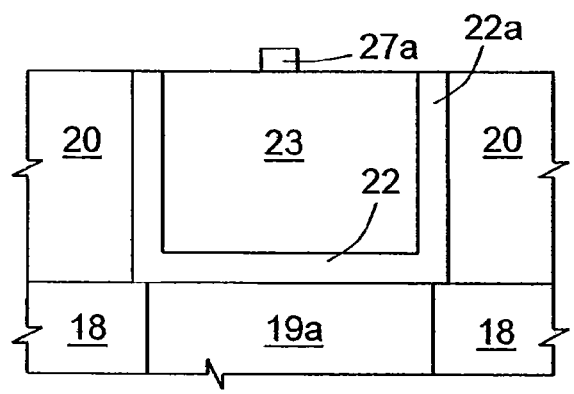

Then, FIG. 9, the remaining portion of the delimiting layer 29 is removed and, FIG. 10, using the vertical wall 28a as a hard mask, the conductive layer 27 is defined. Thereafter, FIG. 11, the vertical wall 28a is removed.

Figure 12:
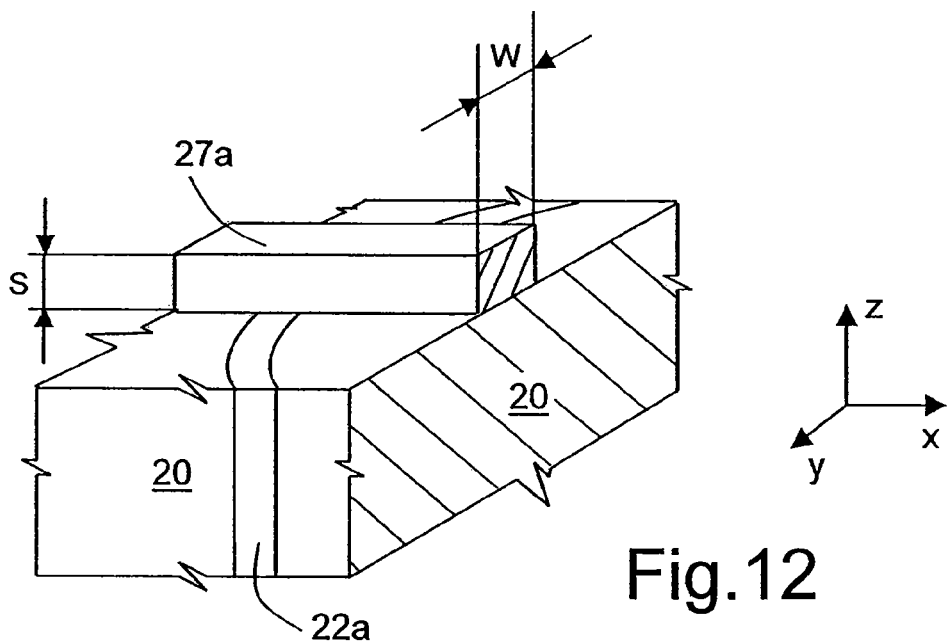
FIG. 12 is a perspective view of the structure of FIG. 11.

Now, as shown in perspective in FIG. 12, the remaining portion of the conductive layer 27 (strip-shaped portion 27a) has a height S and a width W.

Figure 13:
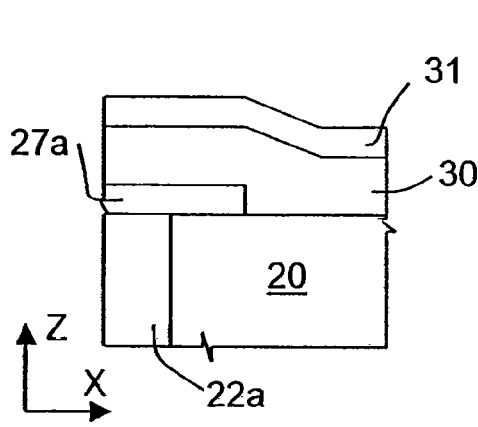

Thereafter, FIG. 13, an insulating layer 30 (e.g., silicon oxide) and an adhesion layer 31 (e.g., Si, Ti, Ta, etc.) are deposited in sequence.

Then, FIG. 14, a trench 32 of lithographic dimensions is opened. The trench 32 is an aperture having a preset length in the direction perpendicular to the drawing sheet, intersects the strip-shaped portion 27a and extends within the second dielectric layer 20 so as to longitudinally delimit the strip-shaped portion 27a. In practice, the trench 32 determines the length L1 of the strip-shaped portion 27a.

Thereafter, FIG. 15, a chalcogenic layer 33, for example of $Ge_2Sb_2Te_5$ having a thickness of e.g., 20-200 nm, is conformally deposited and fills the trench 32 with a reduced area portion 33b the shape and dimensions whereof are determined by the trench 32.

Then, a barrier layer 34, for example of Ti/TiN, and a metal layer 35, for example of AlCu, are deposited in sequence on top of the chalcogenic layer 33; the stack formed by the metal layer 35, the barrier layer 34 and the chalcogenic layer 33 is defined using a same mask, thus forming a bit line 41 including a chalcogenic region 33a and metal regions 34a, 35a. Finally, a third dielectric layer 42 is deposited, which is opened above the base contacts 19b. The openings thus formed are filled with tungsten to form top contacts 43 in order to prolong upwards the base contacts 19b. Then standard steps are performed for forming connection lines in contact with the top contacts 43 and with the bits lines 41, pads are formed and a passivation layer 45 is deposited, defining a device main surface 46. Thus, the final structure of FIG. 16 is obtained.

In practice, the strip-shaped portion 27a (corresponding to the horizontal portion 102 of the first electrode 100 of FIG. 4) has a longitudinal extension parallel to upper surface 16 of the substrate 11 and forms, with the bottom portion of the reduced area portion 33b, a contact area the height whereof is defined by the thickness of the conductive layer 27 and the width whereof is defined by the thickness of the sacrificial layer 28. The quality of the etching of trench 32 determines the orientation of the contact area with respect to the upper surface 16.

The advantages of the present invention are clear from the above. In particular, it is outlined that the present contact structure has a very good technological repeatability, a lower dependence from the process variations than prior art solutions, while maintaining a very small contact area, having sublithographic dimensions in both directions.

Finally, it is clear that numerous variations and modifications may be made to the contact structure and process described and illustrated herein, all falling within the scope of the invention as defined in the attached claims.

In particular, it is stressed that the direction of the horizontal portion 102 and the conductive layer 27 is defined with reference to the upper surface 92, 16 of the substrate, intending therewith a plane corresponding to the original upper surface of the wafer. In practice, the horizontal portion 102 and the conductive layer 27 are perpendicular to the direction of growing of the substrate, due to the deposition of the various superficial layers. If, due to deposition, thermal growing, etching and implant steps carried out on the wafer, the upper surface 16 of the finished device is no more planar, reference may be done to the lower surface 93 of the substrate or to the device main surface 46.

Moreover an alternative embodiment of the present invention provides that the conductive layer 27 is in direct contact with the emitter layer 19a, thus avoiding the dielectric layers 20 and 23 and the cup-shaped region 22.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

The invention claimed is:

1. A process for manufacturing an electronic semiconductor device, comprising:
   providing a body of semiconductor material having an upper surface;
   forming a dielectric layer extending on top of said body; and
   forming a contact structure in said dielectric layer, said forming the contact structure comprising forming a first conducting region and forming a second conducting region of chalcogenic material in electric contact with said first conducting region; wherein:
   forming said first conducting region comprises forming said first conducting region having a longitudinal dimension delimited by an end face extending transversely to said upper surface and the longitudinal dimension; and
   forming the second conducting region comprises forming said second conducting region in contact with said first conducting region at said end face, the end face having width and height dimensions that are smaller than the longitudinal dimension.

2. A process according to claim 1 wherein said end face has a generally rectangular shape having a height comprised between 5 nm and 50 nm and a width comprised between 5 nm and 50 nm.

3. A process according to claim 1 wherein:
   forming the dielectric layer includes forming a first dielectric layer on said body and forming a second dielectric layer on the first dielectric layer; and
   forming said first conducting region comprises depositing a first conductive layer on a top portion of said first dielectric layer before forming the second dielectric layer; forming a delimitation layer on top of said first conductive layer before forming the second dielectric layer, said delimitation layer having a step with a vertical side wall surface; forming a sacrificial portion on said vertical side wall surface before forming the second dielectric layer; removing said delimitation layer; etching said first conductive layer using said sacrificial portion as a mask; and removing said sacrificial portion before forming the second dielectric layer.

4. A process according to claim 3 wherein forming the sacrificial portion comprises depositing a sacrificial layer on said first conducting region and said delimitation layer and anisotropically etching said sacrificial layer.

5. A process according to claim 3 wherein after removing said sacrificial portion, the second dielectric layer is deposited on said first conducting region and said top portion of said first dielectric layer; a trench is formed to remove at least a portion of said top portion and an end portion of said first conducting region, thereby defining said end face; and a second conductive layer of said chalcogenic material is deposited, filling said trench and contacting said end face.

6. A process according to claim 5, comprising forming a PCM device including a memory cell, the memory cell comprising a selection element and a storage element coupled to the selection element, said storage element being formed by a heater element, including said first conducting region, and a storage region comprising said second conducting region.

7. A process according to claim 6, comprising, after depositing said second conductive layer, depositing an electrode layer on the second conductive layer and defining said electrode layer and said second conductive layer, to define a bit line.

8. A process according to claim 1 wherein forming the dielectric layer includes forming a plurality of dielectric layers on top of one another.

9. A process according to claim 1 wherein the first conducting region contacts the second conduction region only with the end face of the first conducting region.

10. A process for manufacturing an electronic PCM device, comprising:
providing a body of semiconductor material having lower surface;
forming a dielectric layer extending on top of the body; and
forming a PCM memory cell that includes a PCM storage element, formed in the dielectric layer, and a selection element coupled to the PCM storage element, the PCM storage element being formed by a heater element and a storage region, the storage region being of chalcogenic material and being in electric contact with the heater element, wherein the heater element has an end face extending transversely to the lower surface and contacting the storage region.

11. The process of claim 10 wherein the heater element includes a lateral portion that extends longitudinally in a direction parallel to the lower surface, the end face being an end face of the lateral portion.

12. The process of claim 10 wherein the end face is substantially perpendicular to the lower surface.

13. The process of claim 10 wherein the end face has a generally rectangular shape having a height and a width, wherein the height is comprised between 5 nm and 50 nm and the width is comprised between 5 nm and 50 nm.

14. The process of claim 10 wherein the selection element is formed in the body, the process further comprising:
forming a lower electrode that extends in the dielectric layer between the selection element and the heater element; and
forming an upper electrode that extends in the dielectric layer on the storage region and forms a bit line.

15. The process of claim 10 the storage region has a reduced area portion in contact with the heater element and an upper enlarged portion extending on top of the reduced area portion and in contact with the upper electrode.

16. The process of claim 10 wherein forming the dielectric layer includes forming a plurality of dielectric layers on top of one another.

17. The process of claim 10 wherein forming the dielectric layer includes forming a first dielectric layer on the body and forming a second dielectric layer on the first dielectric layer, wherein the heater element is formed by:
depositing a first conductive layer on a top portion of the first dielectric layer;
forming a delimitation layer on top of the first conductive layer, the delimitation layer having a step with a vertical side wall surface;
forming a sacrificial portion on the vertical side wall surface;
removing the delimitation layer; etching the first conductive layer using the sacrificial portion as a mask; and
removing the sacrificial portion before forming the second dielectric layer.

18. The process of claim 17 wherein forming the sacrificial portion comprises depositing a sacrificial layer on the first conductive layer and the delimitation layer and anisotropically etching the sacrificial layer.

19. The process of claim 17 wherein after removing the sacrificial portion, the second dielectric layer is deposited on the heater element and the top portion of the first dielectric layer; a trench is formed to remove at least a portion of the top portion and an end portion of the heater element, thereby defining the end face; and a second conductive layer of the chalcogenic material is deposited, filling the trench and contacting the end face.

20. A process for manufacturing an electronic semiconductor device, comprising:
providing a body of semiconductor material having an upper surface;
forming a dielectric layer extending on top of the body; and
forming a contact structure in the dielectric layer by forming a first conducting region and a second conducting region, the second conducting region being of chalcogenic material and being in electric contact with the first conducting region;
wherein the first conducting region has a longitudinal direction delimited by an end face extending transversely to the upper surface and contacting a side wall of the second conducting region, the end face having a width smaller than a corresponding width of the side wall of the second conducting region and a height smaller than a corresponding height of the side wall of the second conducting region.

21. The process of claim 20 wherein the first conducting region extends in a direction parallel to the upper surface.

22. The process of claim 20 wherein the height and width of the end face are each comprised between 5 nm and 50 nm.

23. The process of claim 20, wherein the contact structure is part of a PCM storage element of a PCM memory cell, the PCM memory cell further including a selection element coupled to the storage element, the storage element being formed by a heater element including the first conducting region and a storage region comprising the second conducting region.

24. The process of claim 23 wherein the selection element is formed in the body, a lower electrode extends in the dielectric layer and between the selection element and the first conducting region and an upper electrode extends on the dielectric layer and on the second conducting region and forms a bit line.

25. The process of claim 24 wherein the second conducting region has a reduced area portion in contact with the first conducting region and an upper enlarged portion extending on top of the reduced area portion and in contact with the upper electrode.

26. The process of claim 20 wherein the first conducting region contacts the second conduction region only with the end face of the first conducting region.

27. The process of claim 20 wherein forming the dielectric layer includes forming a first dielectric layer on the body and forming a second dielectric layer on the first dielectriclayer, wherein forming the first conducting region includes:

depositing a first conductive layer on a top portion of the first dielectric layer;

forming a delimitation layer on top of the first conductive layer, the delimitation layer having a step with a vertical side wall surface;

forming a sacrificial portion on the vertical side wall surface;

removing the delimitation layer;

etching the first conductive layer using the sacrificial portion as a mask; and removing the sacrificial portion before forming the second dielectric layer.

28. The process of claim 27 wherein the step of forming the sacrificial portion comprises depositing a sacrificial layer on the first conductive layer and the delimitation layer and anisotropically etching the sacrificial layer.

29. The process of claim 27 wherein after removing the sacrificial portion, the second dielectric layer is deposited on the first conducting region and the top portion of the first dielectric layer; a trench is formed to remove at least a portion of the top portion and an end portion of the first conducting region, thereby defining the end face; and a second conductive layer of the chalcogenic material is deposited, filling the trench and contacting the end face.

* * * * *